(12) United States Patent
Terzioglu

(10) Patent No.: US 7,251,159 B2
(45) Date of Patent: Jul. 31, 2007

(54) DATA ENCODING APPROACH FOR IMPLEMENTING ROBUST NON-VOLATILE MEMORIES

(75) Inventor: Esin Terzioglu, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/031,445

(22) Filed: Jan. 7, 2005

(65) Prior Publication Data
US 2005/0152185 A1  Jul. 14, 2005

Related U.S. Application Data

(60) Provisional application No. 60/535,200, filed on Jan. 9, 2004.

(51) Int. Cl.
*G11C 11/34* (2006.01)
(52) U.S. Cl. .............. 365/185.03; 365/82; 365/104
(58) Field of Classification Search .......... 365/185.03, 365/187, 188, 149, 190, 104, 82
See application file for complete search history.

(56) References Cited

U.S. PATENT DOCUMENTS

| | | | |
|---|---|---|---|
| 6,191,977 B1 * | 2/2001 | Lee .................. | 365/185.21 |
| 6,272,054 B1 * | 8/2001 | Barth et al. ............. | 365/189.06 |
| 6,294,420 B1 * | 9/2001 | Tsu et al. .................... | 438/239 |
| 6,339,550 B1 * | 1/2002 | Wanlass ................. | 365/189.01 |
| 6,529,405 B2 * | 3/2003 | Chang .................. | 365/185.03 |
| 6,826,079 B2 * | 11/2004 | Tran ............................ | 365/171 |
| 6,903,961 B2 * | 6/2005 | Tsukikawa et al. .......... | 365/149 |
| 2002/0141228 A1 * | 10/2002 | Fujino ......................... | 365/149 |

* cited by examiner

*Primary Examiner*—Van Thu Nguyen
*Assistant Examiner*—Dang Nguyen
(74) *Attorney, Agent, or Firm*—McAndrews, Held & Malloy, Ltd.

(57) ABSTRACT

Data encoding system and method for implementing robust non-volatile memories. A data bit is stored using two memory cells. The data bit is represented by setting a voltage level of a first memory cell to a first voltage level and setting a voltage level of a second memory cell to a second voltage level. In one embodiment, the first voltage level and the second voltage level are of opposite polarity. In one embodiment, to store a data bit having the value "0," the first memory cell is set to a first voltage level and the second memory cell is set to a second voltage level of opposite polarity to the first voltage level, and to store a data bit having the value "1," the first memory cell is set to a third voltage level and the second memory cell is set to a fourth voltage level of opposite polarity to the third voltage level. In an illustrative embodiment, the first voltage level is of substantially equal magnitude, and of opposite polarity, to the second voltage level, the third voltage level is of substantially equal magnitude, and of opposite polarity, to the fourth voltage level, the first voltage level is substantially equal to the fourth voltage level, and the second voltage level is substantially equal to the third voltage level. In one embodiment, the data stored according to the present invention is read out by comparing the relative voltages of the first and second memory cells with a differential sense amplifier.

22 Claims, 7 Drawing Sheets

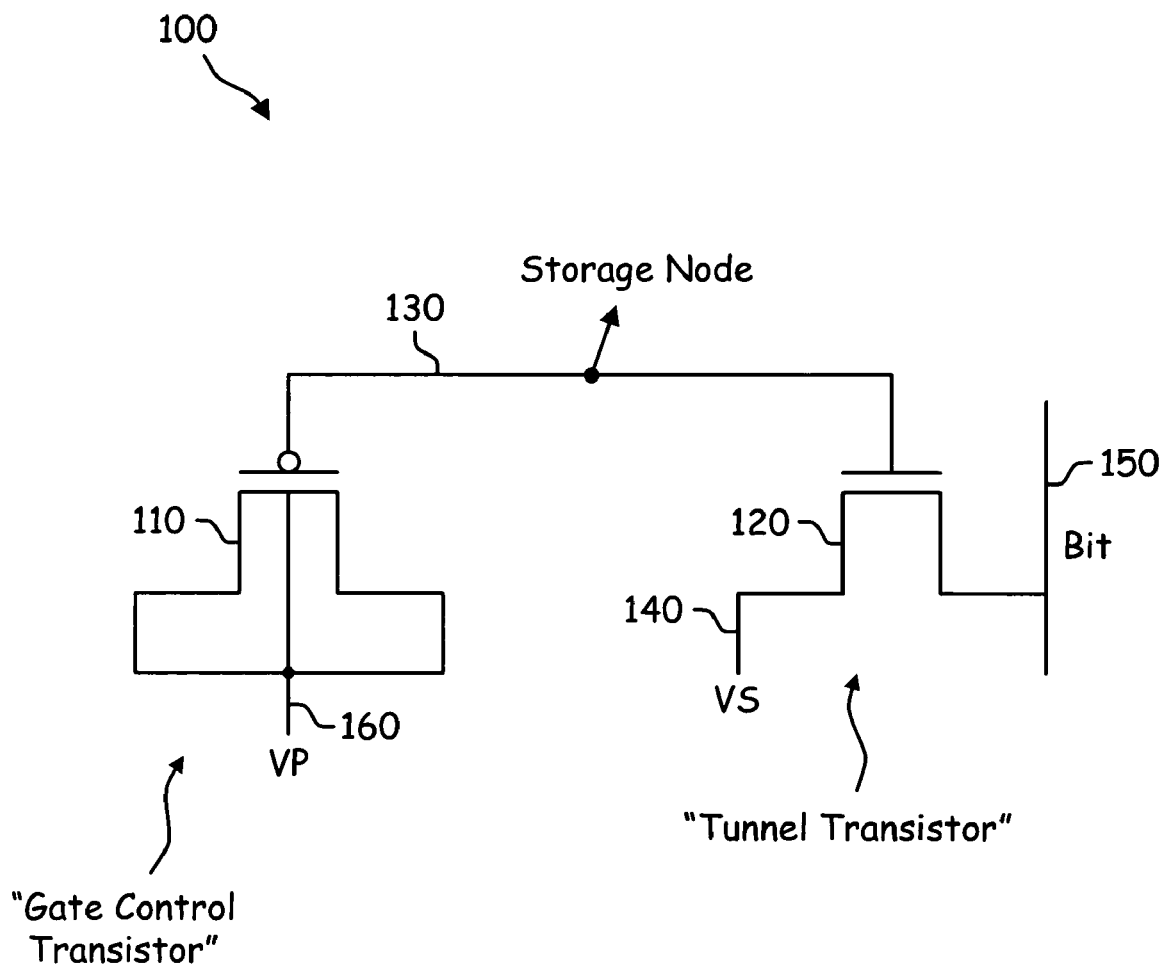
FIG. 1

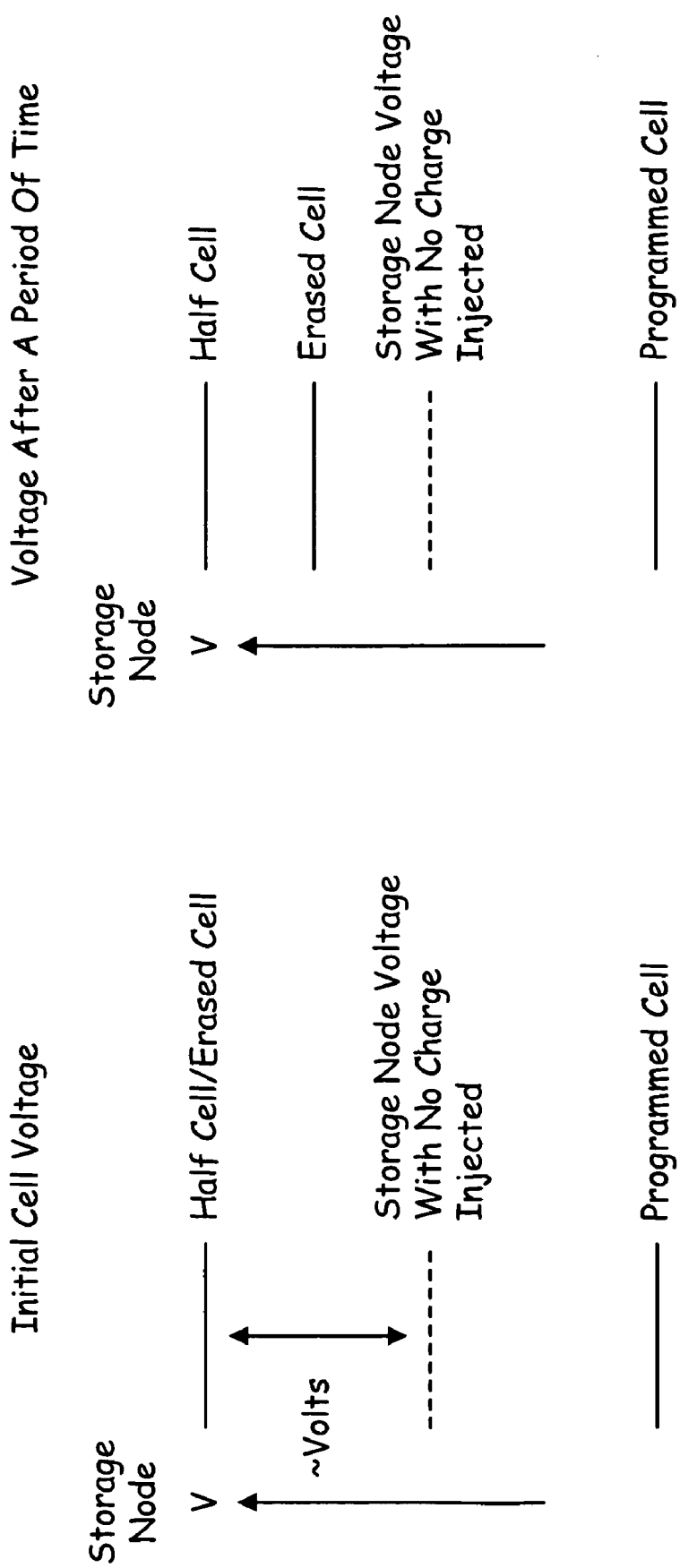
(Prior Art)
FIG. 2A
(Prior Art)
FIG. 2B

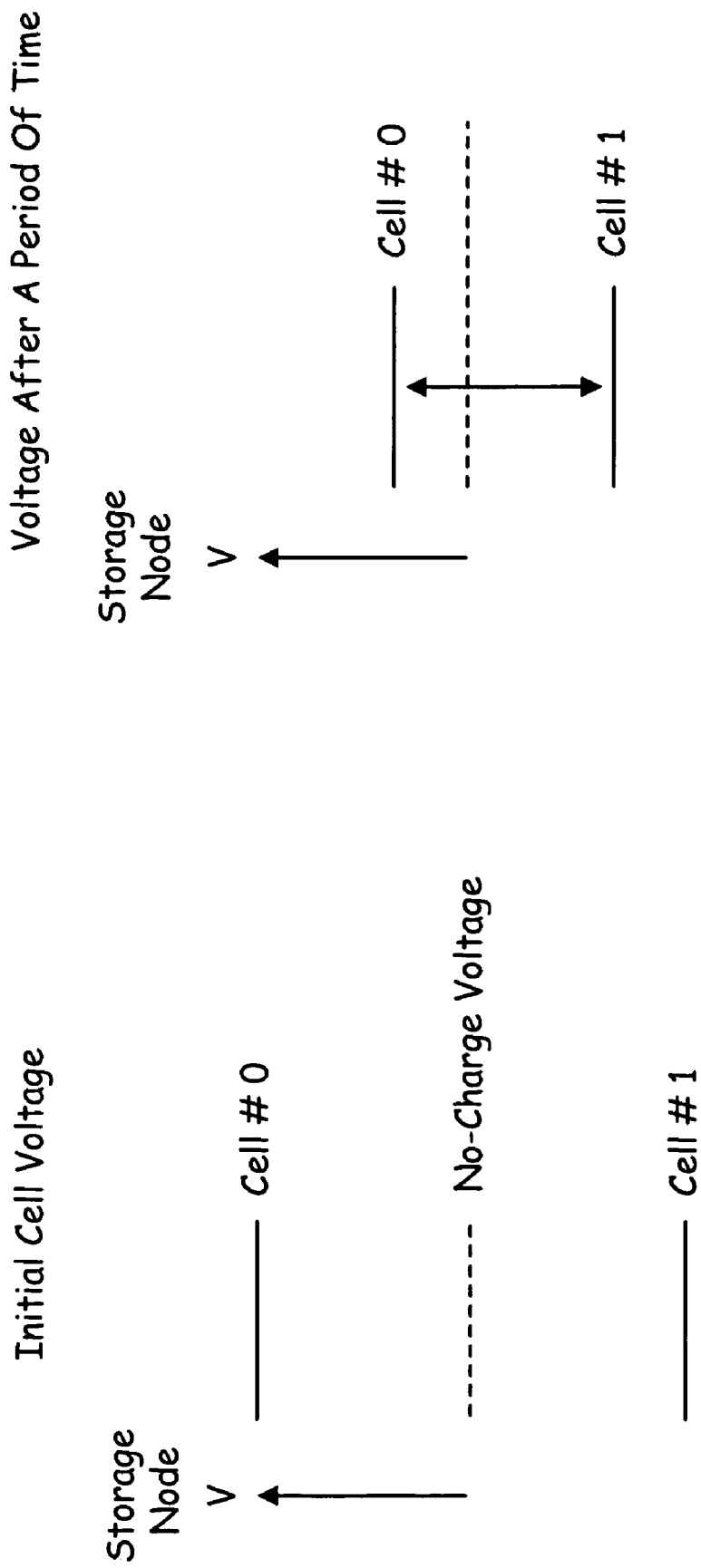
FIG. 3B
FIG. 3A

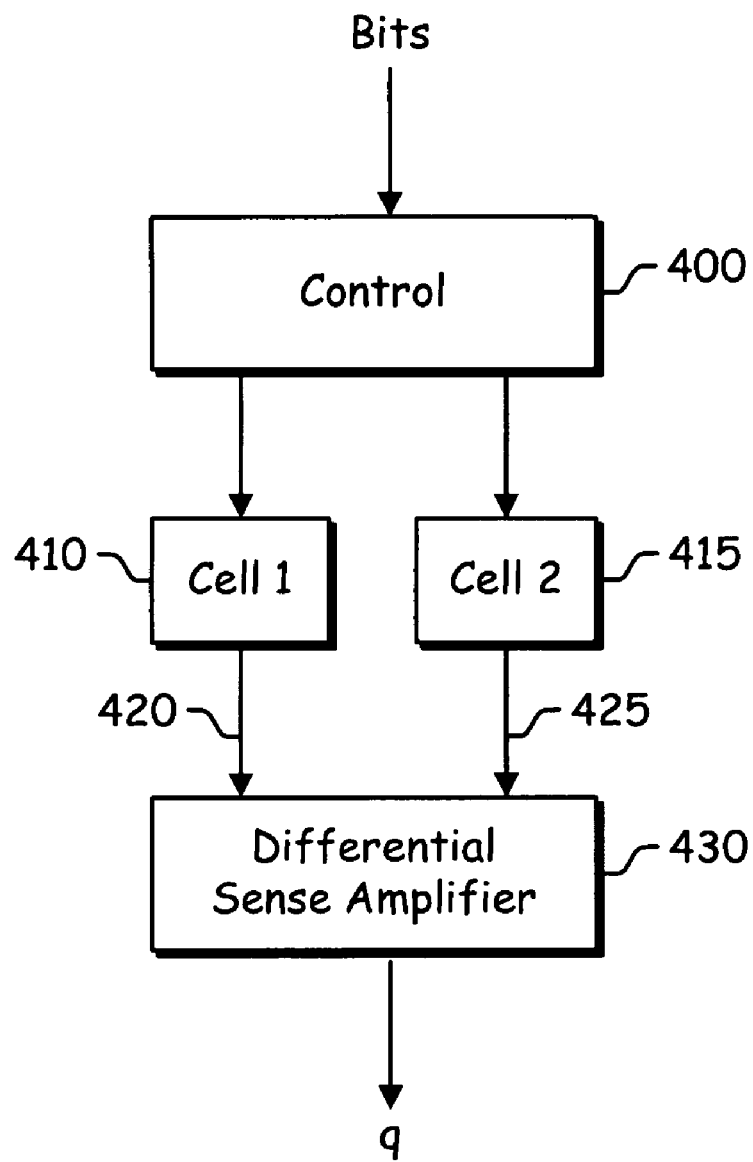
FIG. 4

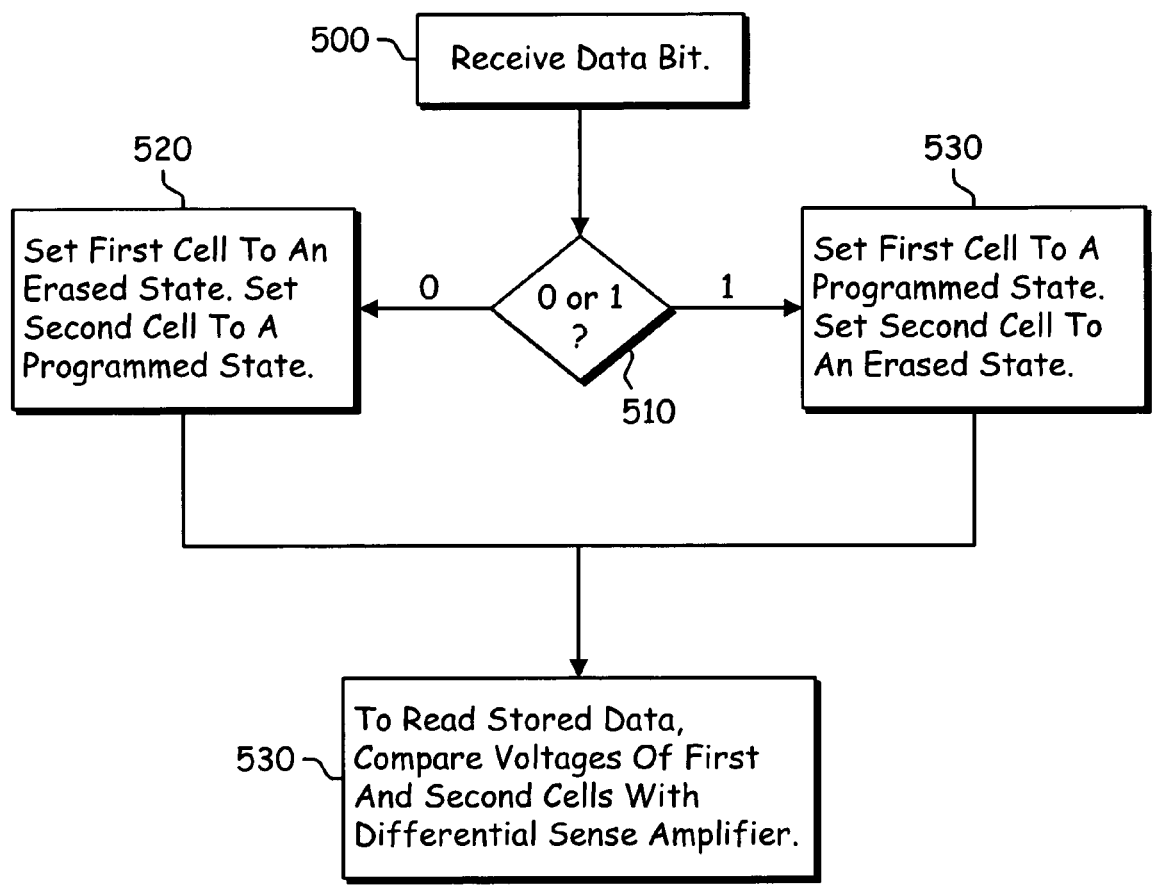
FIG. 5

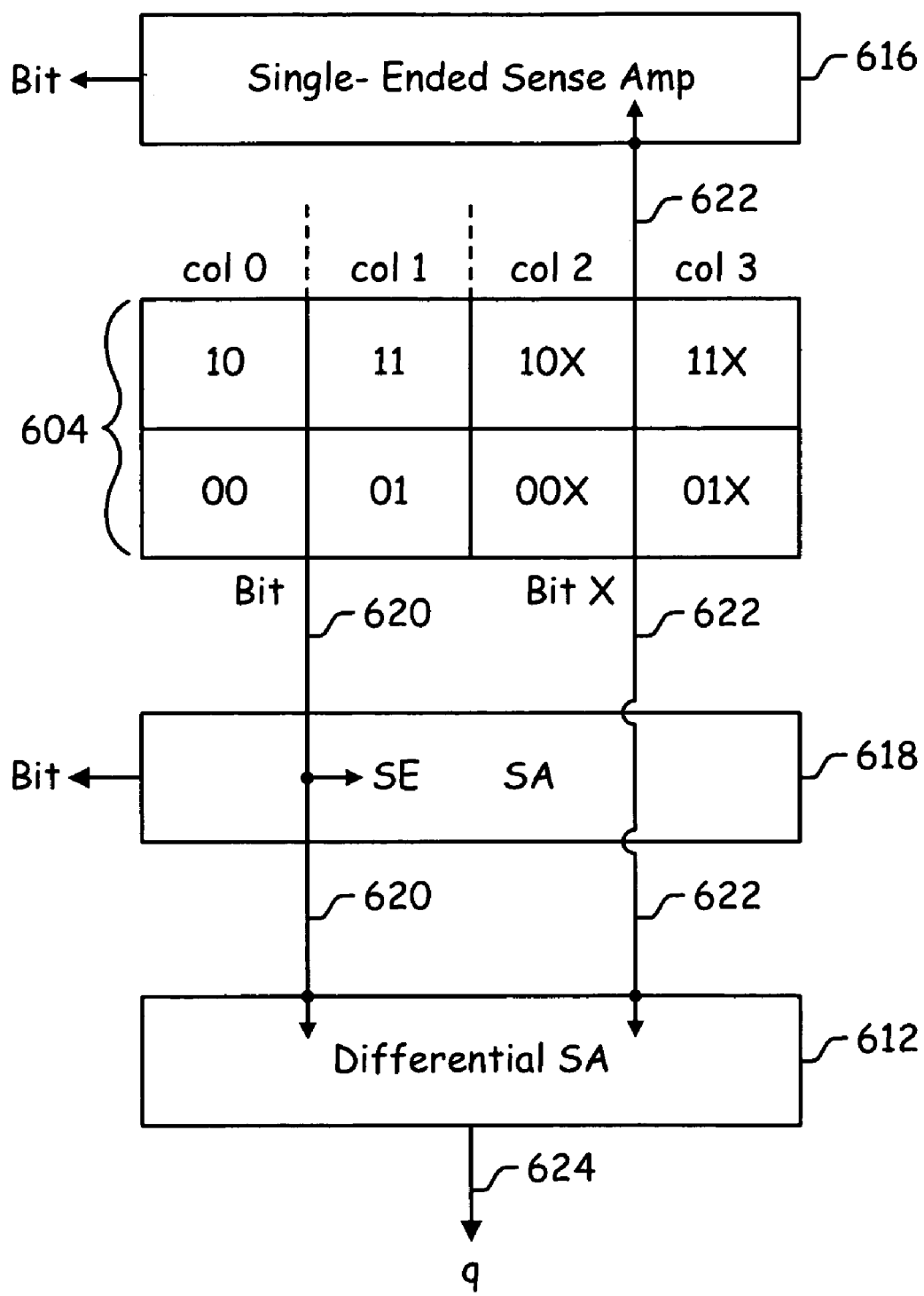
FIG. 6

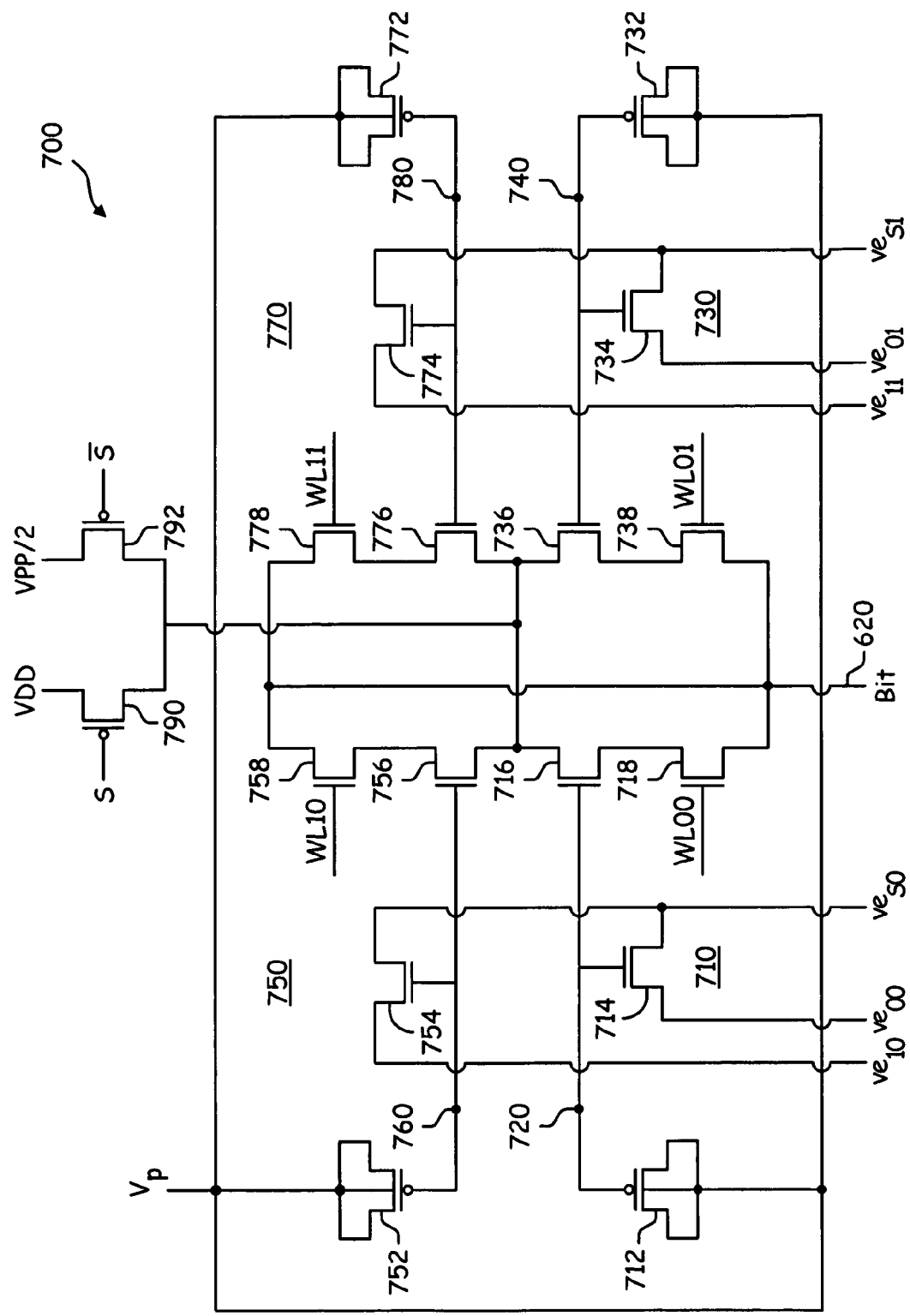
FIG. 7

DATA ENCODING APPROACH FOR IMPLEMENTING ROBUST NON-VOLATILE MEMORIES

RELATED APPLICATIONS

The present application claims priority to U.S. Provisional Application 60/535,200, filed on Jan. 9, 2004, the contents of which are hereby expressly incorporated herein by reference.

BACKGROUND OF THE INVENTION

This invention relates to memory cells and more particularly relates to non-volatile memory cells.

Non-volatile memory cells maintain their contents without the need for an external power supply. In comparison, SRAM, DRAM or other memory technologies lose their contents when the power is switched off. An internal battery is sometimes used to mimic non-volatile memory with SRAM or DRAM. However, an internal battery installation is expensive and cannot guarantee proper operation over long periods of time. It is highly desirable to store certain data, such as boot-up code, chip ID, chip self-repair information, etc., in a non-volatile memory.

Improvements in semiconductor technology have increased the performance of integrated circuits while reducing device dimensions. Unfortunately, conventional techniques for designing planar non-volatile memory cells implemented in standard digital CMOS processes as well as three-dimensional (double-stacked polysilicon) cells implemented using specialized processes have not been able to address the negative effects of leakage currents. Leakage currents give rise to data retention and sense margin issues in a nonvolatile memory as the stored charge decreases due to such undesired leakage currents. Such leakage currents are especially significant in advanced technologies where thin gate oxides are used for the gate dielectric in transistors.

In non-volatile memories, the storage node of a memory cell is prone to leakage currents. Sensing at the storage node of a memory cell is typically performed by way of single-ended sensing, requiring larger voltage margins in order to compensate for loss of charge due to leakage currents. Using current techniques, if an erased cell loses a significant amount of charge, the cell's ability to sense the correct voltage value at a storage node will fail.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Aspects of the present invention may be found in a system and method to more effectively encode data stored within one or more cells of a non-volatile memory so as to reduce or mitigate the negative effects of leakage currents on storage nodes of the one or more cells. Aspects of the present invention allow read out of data stored in cells of a non-volatile memory even when the residual charge of a storage node in a cell has decreased substantially due to such leakage currents.

In one embodiment of the present invention, a method of storing data includes using two memory cells to represent a single bit of data. In an illustrative embodiment, a single bit of data is represented by maintaining a parameter of a first memory cell at a first level and maintaining a parameter of a second memory cell at a second level. In one embodiment, the parameter is voltage and the first voltage level is of substantially equal magnitude, and of opposite polarity, to the second voltage level.

Another embodiment of the present invention is directed to a system for storing data and reading the stored data. The system includes first and second memory cells and a differential sense amplifier. The first and second memory cells are operable to encode a bit of data such that a voltage level of the first memory cell is of substantially equal magnitude, and of opposite polarity, to a voltage level of the second memory cell. The differential sense amplifier is operable to compare the voltage levels of the first and second memory cells and to determine the value of the encoded bit based on the relative voltages of the first and second memory cells.

Another embodiment of the present invention is directed to a method of storing data and reading the stored data. According to said method, a bit of data is encoded such that a voltage level of a first memory cell is of substantially equal magnitude, and of opposite polarity, to a voltage level of a second memory cell. The voltage level of the first memory cell is compared to the voltage level of the second memory cell. The value of the encoded bit is determined based on the relative voltages of the first and second memory cells.

These and other advantages, aspects, and novel features of the present invention, as well as details of illustrated embodiments, thereof, will be more fully understood from the following description and drawings.

BRIEF DESCRIPTION OF THE DRAWINGS

FIG. 1 is a schematic diagram of a nonvolatile bit cell that may be used in an implementation of the present invention.

FIGS. 2A and 2B are voltage diagrams illustrating a conventional design technique in which two states of a storage node within a memory cell are graphed or plotted.

FIGS. 3A and 3B are voltage diagrams illustrating a design technique in accordance with an embodiment of the invention in which two states of a storage node within a memory cell are graphed or plotted.

FIG. 4 is a functional block diagram of a data memory system in accordance with an illustrative embodiment of the present invention.

FIG. 5 is a flow chart illustrating a method of storing a bit of data and reading out said stored data bit according to an illustrative embodiment of the present invention.

FIG. 6 is a system block diagram illustrating the organizational structure of an exemplary 2×2 cell array in accordance with an embodiment of the invention.

FIG. 7 is a transistor-level diagram of an implementation of cells 00, 01, 10, and 11 of the 2×2 cell array shown in FIG. 4 in accordance with an embodiment of the invention.

DETAILED DESCRIPTION OF THE INVENTION

Aspects of the present invention may be found in a system and method to more effectively encode data stored within one or more cells of a non-volatile memory so as to reduce or mitigate the negative effects of leakage currents on storage nodes of the one or more cells. The cumulative effect of leakage current over time affects data stored in cells of the non-volatile memory. Aspects of the present invention allow read-out of data stored in cells of a non-volatile memory even when the residual charge of a storage node in a cell has decreased substantially due to the effects of leakage currents.

Aspects of the invention provide an improvement in sensitivity when determining one or more states of a storage node. In various aspects of the invention, the data to be stored in a nonvolatile memory is encoded such that each bit is represented using two cells or a cell pair. In one embodiment, a first cell of the cell pair stores a first voltage while a second cell of the cell pair stores a second voltage. In one embodiment, the first voltage is of opposite polarity compared to the second voltage.

FIG. 1 is a schematic diagram of a nonvolatile bit cell 100 that may be used in an implementation of the present invention. The cell of FIG. 1 is merely illustrative. The present invention is not limited to this cell structure. The bit cell 100 includes a gate control transistor 110 and a tunnel transistor 120. Gate control transistor 110 is substantially larger in size than the tunnel transistor 120. Therefore, the gate control transistor 110 controls most of the capacitance at the storage node 130. Tunnel transistor 120 is used to inject and extract electrons from the floating storage node 130. For example, electrons can be injected into the storage node 130 by passing current through the tunnel transistor 120 at a high bias voltage resulting in hot electron programming of the bit cell 100. The VS node 140 and the bitline node 150 are biased to a high voltage to directly extract electrons from the storage node 130 for an erase operation. Tunnel transistor 120 is biased and the current at the bitline node 150 is measured for a read operation. If the cell is programmed, very little current flows through the bitline 150. If the cell is erased, substantial current flows through the bitline 150. As can be seen, the nonvolatile cell 100 is inherently single-ended (as opposed to a 6-T SRAM cell where sensing and writing are all differential). Single-ended sensing is more difficult in practice and generally requires more margin to attain robust operation. During a read operation, the voltage $V_p$ 160 biasing the tunnel transistor is important. Generally $V_p$ is adjusted such that the voltage of the storage node 130 is close to the threshold voltage of the tunnel transistor 120 so that any additional charge injected by program and erase operations will have maximum effect on device current during reads.

FIGS. 2A and 2B are voltage diagrams illustrating a conventional design technique. FIGS. 2A and 2B plot two operational states of a storage node within a memory cell. The vertical axis plots voltage at the storage node of the memory cell in relation to the two operational states. FIG. 2A illustrates the initial voltages at the storage node of a cell corresponding to the two operational states. The two operational states are of opposite polarities centered around a state that corresponds to a storage node containing no charge. FIG. 2B illustrates voltages at a storage node of a cell for the two initial voltage states, shown in FIG. 2A, after some period of time has elapsed. In FIGS. 2A and 2B, the exemplary two operational voltage states plotted correspond to an erased cell state and a programmed cell state of a cell in a memory array. These states may be used to represent the value of a data bit. For example, these two states may represent the value "0" and the value "1." As leakage current reduces the charge stored within a storage node, the erased cell voltage decreases. As a consequence, the voltage difference between the two states diminishes. If the erased cell voltage decreases to a great enough degree, the sensing circuitry will not be able to sense the erased state, leading to an erase failure. In some embodiments, if the erased cell voltage decreases by 50%, an erase failure will result. Hence, the ability of the conventional design to discriminate between the erased cell state and the programmed cell state diminishes as the erased cell voltage decreases.

FIGS. 3A and 3B are voltage diagrams illustrating a design technique in accordance with an embodiment of the invention. As described in relation to FIGS. 2A and 2B, the operational states used in various aspects of the invention correspond to an erased cell state and a programmed cell state. The states (e.g., voltage states) of the storage nodes within two memory cell are graphed or plotted as illustrated in the storage node voltage graphs of FIGS. 3A and 3B. These exemplary voltage states are used to represent or encode the value of a single data bit. According to the present invention, the states of each of two cells, or the two states of each cell pair, are used to encode the value of a data bit. In various aspects of the present invention, the state of the first cell of a cell pair is characterized by one or more parameters (e.g., voltage) that is the opposite of the corresponding one or more parameters of the state of the second cell. In one embodiment, the states comprise voltages of opposite polarity. In an illustrative embodiment of the present invention, a bit is encoded by maintaining the first cell of a cell pair at a first voltage level and maintaining the second cell of a cell pair at a second voltage level. In one embodiment, the voltage level of the first cell is of opposite polarity to the voltage level of the second cell. In a further illustrative embodiment, the voltage level of the first cell is of substantially equal magnitude, and of opposite polarity, to the voltage level of the second cell. In one embodiment, the data bit value corresponds to the value "0" or the value "1." For example, the value "0" may be represented when the first cell is encoded as an erased cell state while the second cell is encoded as a programmed cell state, as illustrated in FIG. 3A. In similar fashion, a "1" may be represented when the first cell is encoded as a programmed cell state while the second cell is encoded as an erased cell state. In an alternative embodiment, the bit value "1" may be represented when the first cell is encoded as an erased cell state while the second cell is encoded as a programmed cell state while a "0" is represented when the first cell is encoded as a programmed cell state while the second cell is encoded as an erased cell state. In an exemplary embodiment of the present invention, the erased state of the first cell corresponds to substantially the same voltage as the erased state of the second cell, while the programmed state of the first cell corresponds to substantially the same voltage as the programmed state of the second cell.

In one embodiment, the outputs of each of these cell pairs are connected by way of a pair of bitlines to a differential sense amplifier. A bitline pair comprises a first bitline and a second bitline. In one embodiment, the voltage of the first cell of each cell pair is provided by the first bitline while the voltage of the second cell of each cell pair is provided by the second bitline. The differential sense amplifier compares the voltage levels of the two cells of the cell pair. The differential sense amplifier thus compares two voltage levels that are opposite to each other in polarity. As discussed and illustrated in FIGS. 2A and 2B previously, the programmed cell state is characterized by a parameter (e.g., a voltage) that is of opposite polarity compared to the erased cell state. By using this technique, an improvement in resolving the stored data is attained. In addition, this scheme provides redundancy that increases the reliability of the system. That is, if one memory cell fails and the other memory cell remains functional, the storage will be successful. In prior systems, if one memory cell failed, the corresponding data would be lost.

FIG. 3B shows the voltage levels of two complementary memory cells after a period of time has elapsed. As leakage current reduces the charge stored within a storage node, the voltage level of each cell decreases. As a consequence, the voltage difference between the erased state and the programmed state diminishes. However, using the scheme of the present invention, small differences between the voltages of the two cells can be sensed. As long as the voltage difference between the cell pairs toggles the sense amplifier within a given integration time, the correct data is sensed. In some embodiments, threshold shifts may be well below a volt using the present invention. As a consequence, thinner gate oxide layers may be used to build nonvolatile memories.

FIG. 4 is a functional block diagram of a data memory system in accordance with an illustrative embodiment of the present invention. The memory system of FIG. 4 includes a control module 400, memory cells 410 and 415, and differential sense amplifier 420. The control module 400 receives data to be stored in memory. The control module 400 causes the voltage levels of the complementary memory cells 410 and 415 to be set according to the value of the bit to be encoded, as described above with respect FIGS. 3A and 3B. In one embodiment, if the bit to be encoded is a "0," control module 300 causes cell 1 (410) to be set to an erased state and cell 2 (415) to be set to a programmed state. In said embodiment, if the bit to be encoded is a "1," control module 400 causes cell 1 (410) to be set to an programmed state and cell 2 (415) to be set to an erased state. In an alternative embodiment, if the bit to be encoded is a "0," control module 400 causes cell 1 (410) to be set to an programmed state and cell 2 (415) to be set to a erased state. In said alternative embodiment, if the bit to be programmed is a "1," control module 400 causes cell 1 (410) to be set to an erased state and cell 2 (415) to be set to a programmed state. Both cells of a cell pair are coupled to corresponding bitlines 420 and 415 by a readout transistor gated by a wordline selection transistor (not shown). Thus the storage node voltage for each cell is transferred to its corresponding bitline by the readout transistor gated by the wordline selection transistor. When one of the two memory cells 410 and 415 is erased and the other is programmed, the erased cell passes current which causes its corresponding bitline to be higher voltage than the bitline corresponding to the programmed cell. Differential sense amplifier 430 senses the relative voltages of the memory cells 410 and 415 and outputs a bit value q based on said relative voltages. In an exemplary scheme wherein a data bit of value "0" is represented by cell 1 (410) being erased and cell 2 (415) being programmed, and a data bit of value "1" is represented by cell 1 (410) being programmed and cell 2 (415) being erased, the output of the differential sense amplifier 430 will be "0" for a data bit of value "0," and "1" for a data bit of value "1."

FIG. 5 is a flow chart illustrating a method of storing a bit of data and reading out said stored data bit according to an illustrative embodiment of the present invention. At block 500, a data bit to be stored is received, for example, by a control module 400. At decision block 510, it is determined whether the data bit to be stored is a "0" or a "1." In an illustrative embodiment, this determination is made by a control module such as control module 400. In the illustrative embodiment of FIG. 5, if the bit to be stored is a "0," a first memory cell, such as memory cell 410, is set to an erased state, and a second memory cell, such as memory cell 415, is set to a programmed state, as shown at block 520. If the bit to be stored is a "1," a first memory cell, such as memory cell 410, is set to a programmed state, and a second memory cell, such as memory cell 415, is set to an erased state, as shown at block 530. When the data stored in the memory cells 410 and 415 is to be read, the voltage of the first cell 410 is compared to the voltage of the second cell 415, as shown at block 530. In an illustrative embodiment, this comparison is performed by a differential sense amplifier 420. The value of the stored data bit is determined based upon the relative voltages of cell 410 and cell 415. In an alternative embodiment of the present invention, if the bit to be stored is a "0," a first memory cell, such as memory cell 410, is set to a programmed state, and a second memory cell, such as memory cell 415, is set to an erased state, while if the bit to be stored is a "1," a first memory cell, such as memory cell 410, is set to an erased state, and a second memory cell, such as memory cell 415, is set to a programmed state.

FIG. 6 is a system block diagram illustrating the organizational structure of an exemplary 2×2 cell array 604 in accordance with an embodiment of the invention. As illustrated, a total of four data bits may be encoded using the eight cells (four pairs of cells) in this 2×2 cell array 604. In this exemplary organizational embodiment, the first cells of one or more pairs reside in a first column pair in a memory cell array while the second cells of the one or more pairs reside in a second column pair of the memory cell array. Column 0 (col0) and column 1 (col1) make up a first column pair. Column 2 (col2) and column 3 (col3) make up a second column pair. For example, cell 00 in column 0 (col0) is complementary to cell 00X in column 2 (col2). As will be seen in relation to FIG. 7, the cells within a column pair are accessed separately by odd/even wordlines. Neighboring columns within a column pair are connected to the same bitline. That is, cell column 0 (col0) and cell column 1 (col1) are connected to the bitline 620. Similarly, cell column 2 (col2) and cell column 3 (col3) are connected to bitline 622. The bitline 620 is used to read out one or more states of cells 00, 01, 10, 11 while the bitline 622 is used to read out one or more states of complementary cells 00X, 01X, 10X, 11X of the 2×2 cell array 604.

In the system shown in FIG. 6, both a differential sense amplifier 612 and two single-ended sense amplifiers 616 and 618 are utilized. The single-ended sense amplifiers 616 and 618 utilize a fixed voltage reference generation. The outputs of a cell are transmitted to the differential sense amplifier 612 or one of the single-ended sense amplifiers 616 and 618 by way of the bitlines 620 and 622. The cells in column 0 (col0) and column 1 (col1) are associated with single-ended sense amplifier 616. The cells in column 2 (col2) and column 3 (col3) are associated with single-ended sense amplifier 618. In one embodiment, the single ended sense amplifiers 616 and 618 may be used to verify the single-ended value of each cell of a cell pair. In one embodiment, this single-ended value may be used to implement error correction and refresh algorithms for the nonvolatile memory array. For example, if the single-ended sense amplifiers 616 and 618 read the values of both cells of a cell pair (that is, from both the first cell and from its complementary cell) as "0," and the output of the differential sense amplifier, which is more sensitive, reads "0", it implies that the first cell has leaked and cannot be correctly read in single-ended mode. This bit may be corrected by re-programming it to its proper value. Note that if there is a failure, single-ended failure occurs before the differential sense amplifier fails. Thus cell pairs can be refreshed before a failure in operational mode, i.e., differential sensing, occurs. As shown in FIG. 6, the output of the differential sense amplifier 612 generates a data bit value q (624), corresponding to the value of the data stored in the cell memory. In one embodiment, the data bit value q (624) comprises a "0" or "1" value.

FIG. 7 is a transistor level diagram of an implementation of cells 00, 01, 10, and 11 of the 2×2 cell array 604 shown in FIG. 6 in accordance with an embodiment of the invention. Note that, for the sake of brevity, the complementary cells (e.g., cells 00X, 01X, 10X, and 11X as previously shown in FIG. 4) of each cell pair are not shown in FIG. 7. Cell 00 is indicated generally by reference number 710, cell 01 by reference number 730, cell 10 by reference number 750 and cell 11 by reference number 770. Cell 00 710 includes gate control transistor 712, erase transistor 714, tunnel transistor 716, cell select transistor 718 and storage node 720. Cell 01 730 includes gate control transistor 732, erase transistor 734, tunnel transistor 736, cell select transistor 738 and storage node 740. Cell 10 750 includes gate control transistor 752, erase transistor 754, tunnel transistor 756, cell select transistor 758 and storage node 760. Cell 11 770 includes gate control transistor 772, erase transistor 774, tunnel transistor 776, cell select transistor 778 and storage node 780. The gate control transistors 712, 732, 752, 772 are substantially larger than the erase transistors 714, 734, 754, 774 and the tunnel transistors 716, 736, 756, 776. Therefore the gate control transistors control most of the capacitance at the storage nodes 720, 740, 760, 780. In the illustrative embodiment of FIG. 7, all of the transistors are metal oxide semiconductor (MOS) field effect transistors. In particular, the gate control transistors 712, 732, 752 and 772 are p-type MOS (PMOS) transistors. The erase transistors 714, 734, 754 and 774, tunnel transistors 716, 736, 756 and 776 and cell select transistors 718, 738, 758 and 778 are n-type MOS (NMOS) transistors. The cell array design shown in FIG. 7 is merely illustrative. The present invention is not limited to the cell array design of FIG. 7.

Transistors 790 and 792 form a voltage selection circuit that selects the voltage that is to be applied to the sources of tunnel transistors 716, 736, 756 and 776. In the illustrative embodiment of FIG. 7, transistors 790 and 792 are PMOS transistors. VPP is the logic-high voltage used to program and erase a cell. VPP represents a voltage value that has a high range, on the order of 6-7 volts, for example. $V_p$ is the horizontal high voltage signal. $V_p$ is set to logic-high during programming of one of the cells. In an illustrative embodiment, cell row pairs share the same $V_p$, due in part to layout considerations. Thus, in FIG. 7, Cells 00, 01, 10 and 11 share the same $V_p$. The cell array 700 also receives a plurality of vertical high voltage signals $ve_{00}$, $ve_{01}$, $ve_{10}$, $ve_{11}$, $ve_{S0}$ and $ve_{S1}$. The plurality of vertical high voltage signals allow for selective cell program and erase capability. The vertical high voltage signals $ve_{00}$, $ve_{01}$, $ve_{10}$, $ve_{11}$, $ve_{S0}$ and $ve_{S1}$ are used to program/erase one out of four cells while not affecting the other three. The cells are accessed separately by wordlines WL00, WL01, WL10, WL11. The wordlines provide control signals to the cell select transistors 718, 738, 758 and 778 in order to select a particular cell within the cell array. For example, WL10 may be used to select cell #10 when a read operation occurs.

The operation of cell 00 710 will now be described. It will be understood that the operation of cells 01, 10 and 11 is substantially similar to the operation of cell 00. To program cell 00 710, $V_p$ is raised to a logic-high level (approximately 4 volts in an illustrative embodiment). Vertical high voltage signal $ve_{00}$ is held at a logic-low level (approximately 0 volts in an illustrative embodiment) while the other vertical high voltage signals $ve_{01}$, $ve_{10}$, $ve_{11}$, $ve_{S0}$ and $ve_{S1}$ are maintained at a logic-high voltage level. Raising $V_p$ to a logic-high level results in the voltage levels of the storage nodes 720, 740, 760, 780 being raised, because most of the storage node capacitance of the storage nodes 720, 740, 760, 780 is through the respective gate control transistors 712, 732, 752, 772. Because $ve_{S0}$=4V and $ve_{00}$=0V, the cell 00 erase transistor 714 passes current with high bias. This results in hot electron injection into storage node 720. That is, excess electrons are injected into storage node 720, thereby programming cell 00 710. Because the $ve_{XX}$ and $ve_S$ signals of the cells not to be programmed are both at the same voltage (~4V), these cells do not have any current flowing through their erase transistors.

Bitline 620 facilitates reading out one or more states of the cells in the exemplary 2×2 cell array shown. To read cell 00 710, the tunnel transistor 716 is biased and the current in the bitline 620 is measured. If the cell 710 is programmed, very little current flows through the bitline 620. If the cell is erased, substantial current flows through the bitline 620.

The erase operation is performed in sectors (large blocks). For example, to erase the first column (cell 00 710 and cell 10 750), the vertical high voltage signals $ve_{00}$, $ve_{10}$ and $ve_{S0}$ are raised to a high voltage (in an illustrative embodiment, approximately 6 volts), while keeping $V_p$ at 0 volts in the rows to be erased. Electrons are extracted from the storage node by direct injection, thereby erasing the cell. In columns not to be erased, $ve_{SX}$ and $ve_{XX}$ are maintained at VPP/2 (approximately 3 volts in an illustrative embodiment). In this way, inactive cells are substantially unaffected.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A system for storing data and reading the stored data, comprising:
   first and second memory cells that are operable to encode a bit of data having a value of 0 such that the voltage of the first memory cell is maintained at a first level and the voltage of the second memory cell is maintained at a second level, wherein the first voltage level is of opposite polarity to the second voltage level, and wherein the first and second memory cells are operable to encode a bit having a value of 1 such that the voltage of the first memory cell is maintained at a third level and the voltage of the second memory cell is maintained at a fourth level, wherein the third voltage level is of opposite polarity to the fourth voltage level;
   a differential sense amplifier operable to compare the voltage levels of the first and second memory cells and to output a bit value based on the comparison; and
   at least one single-ended sense amplifier operable to compare the voltage level of at least one of the first and second memory cells to a fixed reference voltage and to output a bit value based on the comparison.

2. The system of claim 1 wherein the first and second memory cells include storage nodes and wherein the first and second memory cells are operable to encode a bit of data having a value of 0 such that the voltage of the storage node of the first memory cell is maintained at the first voltage level and the voltage of the storage node of the second memory cell is maintained at the second voltage level, and wherein the first and second memory cells are operable to encode a bit having a value of 1 such that the voltage of the storage node of the first memory cell is maintained at the third voltage level and the voltage of the storage node of the second memory cell is maintained at the fourth voltage level.

3. The system of claim 1 wherein the differential sense amplifier is operable to determine the value of the encoded bit based on the relative voltages of the first and second memory cells.

4. The system of claim 1 wherein the first voltage level is of substantially equal magnitude, and of opposite polarity, to the second voltage level, and wherein the third voltage level is of substantially equal magnitude, and of opposite polarity, to the fourth voltage level.

5. The system of claim 4 wherein the first voltage level is substantially equal to the fourth voltage level and wherein the second voltage level is substantially equal to the third voltage level.

6. The system of claim 1 wherein the differential sense amplifier is operable to determine the value of the encoded bit based on the relative voltages of the first and second memory cells.

7. A method of storing data and reading the stored data, comprising:
    storing a bit value of 0 by maintaining a first memory cell at a first voltage level and maintaining a second memory cell at a second voltage level, wherein the first voltage level is of opposite polarity to the second voltage level;
    storing a bit value of 1 by maintaining the first memory cell at a third voltage level and maintaining the second memory cell at a fourth voltage level, wherein the third voltage level is of opposite polarity to the fourth voltage level;
    comparing the voltage levels of the first and second memory cells and producing a bit value based on the comparison; and
    comparing the voltage level of at least one of the first and second memory cells to a fixed reference voltage and producing a bit value based on the comparison.

8. The method of claim 7 wherein maintaining the first memory cell at the first voltage level comprises maintaining a storage node of the first memory cell at the first voltage level, maintaining the second memory cell at the second voltage level comprises maintaining a storage node of the second memory cell at the second voltage level, maintaining the first memory cell at the third voltage level comprises maintaining the storage node of the first memory cell at the third voltage level, and maintaining the second memory cell at the fourth voltage level comprises maintaining the storage node of the second memory cell at the fourth voltage level.

9. The method of claim 7 further comprising determining the value of the stored bit based on the relative voltages of the first and second memory cells.

10. The method of claim 7 wherein the first voltage level is of substantially equal magnitude, and of opposite polarity, to the second voltage level, and wherein the third voltage level is of substantially equal magnitude, and of opposite polarity, to the fourth voltage level.

11. The method of claim 10 wherein the first voltage level is substantially equal to the fourth voltage level and wherein the second voltage level is substantially equal to the third voltage level.

12. The method of claim 7 further comprising determining the value of the encoded bit based on the relative voltages of the first and second memory cells.

13. The system of claim 1 wherein the at least one single-ended sense amplifier is operable to compare the voltage level of the first memory cell to a fixed reference voltage to produce a first bit value and to compare the voltage of the second memory cell to a fixed reference voltage to produce a second bit value.

14. The system of claim 13 wherein the at least one single-ended sense amplifier comprises a first single-ended sense amplifier operable to compare the voltage level of the first memory cell to a first fixed reference voltage to produce a first bit value and a second single-ended sense amplifier operable to compare the voltage of the second memory cell to a second fixed reference voltage to produce a second bit value.

15. The system of claim 13 wherein the at least one single-ended sense amplifier is used to implement error correction for the first and second memory cells.

16. The system of claim 15 wherein if the first and second bit values are the same, one of the first and second memory cells is deemed to be in error.

17. The system of claim 16 wherein the output of the differential sense amplifier is used to determine which of the first and second memory cells is in error.

18. The method of claim 7 wherein comparing the voltage level of at least one of the first and second memory cells to a fixed reference voltage comprises comparing the voltage level of the first memory cell to a fixed reference voltage to produce a first bit value and comparing the voltage of the second memory cell to a fixed reference voltage to produce a second bit value.

19. The method of claim 18 wherein comparing the voltage level of at least one of the first and second memory cells to a fixed reference voltage comprises comparing the voltage level of the first memory cell to a first fixed reference voltage to produce a first bit value and comparing the voltage of the second memory cell to a second fixed reference voltage to produce a second bit value.

20. The method of claim 18 further comprising performing error correction for the first and second memory cells based on the first and second bit values.

21. The method of claim 20 further comprising:
    comparing the first and second bit values; and
    deeming one of the first and second memory cells to be in error if the first and second bit values are the same.

22. The method of claim 21 further comprising using the output of the differential sense amplifier to determine which of the first and second memory cells is in error.

* * * * *